Figure 1:
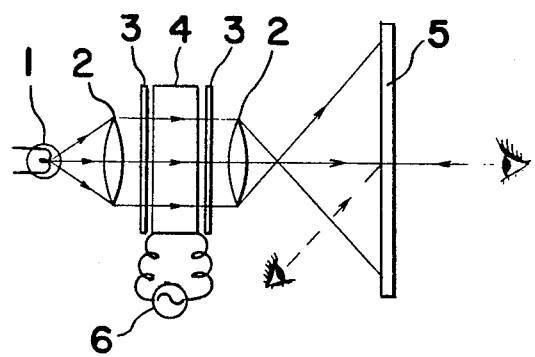

United States Patent [19]

Nonomura et al.

[11] 4,411,496
[45] Oct. 25, 1983

[54] DAP, LCD DEVICE WITH A BIAS VOLTAGE

[75] Inventors: Keisaku Nonomura; Masataka Matsura, both of Tenri; Tomio Wada, Nara; all of Japan

[73] Assignee: Sharp Kabushiki Kaisha, Osaka, Japan

[21] Appl. No.: 102,931

[22] Filed: Dec. 12, 1980

Related U.S. Application Data

[63] Continuation of Ser. No. 829,285, Aug. 31, 1977, abandoned.

[30] Foreign Application Priority Data

Aug. 31, 1976 [JP] Japan .............................. 52-105139

[51] Int. Cl.³ ...................... G02F 1/133; G02F 1/137
[52] U.S. Cl. .................... 350/347 E; 350/332
[58] Field of Search ................. 350/331 R, 332, 336, 350/346, 347 E, 347 V, 347 R; 340/700, 765, 784

[56] References Cited

U.S. PATENT DOCUMENTS

| | | | |
|---|---|---|---|
| 3,785,721 | 1/1974 | Harsch et al. | 350/347 E |
| 4,035,060 | 7/1977 | Tsunoda et al. | 350/336 |
| 4,340,277 | 7/1982 | Kaufman et al. | 350/347 E |

OTHER PUBLICATIONS

Sato et al., "Frequency Color Display by Nematic Liquid Crystals", *Japan J. Appl. Phys.*, vol. 13, No. 3, 1974, pp. 559-560.

*Primary Examiner*—John K. Corbin
*Assistant Examiner*—David Lewis
*Attorney, Agent, or Firm*—Birch, Stewart, Kolasch & Birch

[57] ABSTRACT

A liquid crystal color display device including a liquid crystal display cell having a Fredericksz transition effect, and a driving circuit for the display cell. At least one of the opposed electrodes of the liquid crystal display cell is divided into a plurality of electrode members aligned in a row, while the driving circuit supplies driving voltages to the plurality of electrode members corresponding to sound signals, the driving voltages being supplied sequentially having different levels in the order of alignment of the plurality of electrode members. The display device further includes a circuit for lowering the AC power source voltage to bias voltage or a predetermined low voltage level, the AC power source voltage being supplied to a common electrode member formed by the other opposed electrodes of the liquid crystal display cell the power-source voltage applying a potential difference to the liquid crystal, the potential difference being equal to the difference between the driving voltages and the predetermined low voltage.

8 Claims, 10 Drawing Figures

DAP, LCD DEVICE WITH A BIAS VOLTAGE

This application is a continuation of copending application Ser. No. 829,285, filed on Aug. 31, 1977, now abandoned.

The present invention relates to a display device, and more particularly to a color display device wherein a liquid crystal display device is utilized.

Recently, great progress has been made in the application of liquid crystals for display material, various appliances employing a LCD or a liquid crystal display means. Different from other flat surface display means such as light emission diode panels, etc., the liquid crystal display means is particularly characterized by its "passive" nature of display without the emission of light itself, and has several advantages such as extremely small power consumption and low driving voltage, while the display is clear and exhibits better contrast as the intensity of external light increases.

Conventionally, liquid crystals are used in various display modes such as DSM (dynamic scattering mode), FEM (field effect mode), thermal effect mode, etc., the field effect mode being employed for color display and utilizing interference of polarized light through variation of the degree of double refraction and making alignment of liquid crystal molecules uniform by means of an electric field, and includes, for example, a color display mode generally referred to as a DAP (deformation of vertical aligned phases) system which utilizes the known Fredericksz transition effect.

The conventional color display means of liquid crystal as described above, however, have various disadvantages in its functioning efficiency and stability for color display, there still being a considerable room for improvement in its structure and functioning.

Accordingly, an essential object of the present invention is to provide a color display device of liquid crystal composition having the Fredericksz transition effect and capable of efficient display wherein the range by which the liquid crystal remains in a functioning state varies depending on the magnitude of the control signal, while, at the same time, display of different colors is readily effected at each part of the liquid crystal in the functioning state.

Another important object of the present invention is to provide a color display device of the above described type which is simple in construction and stable when functioning, and can be readily incorporated into various appliances at low cost.

In order to accomplish these and other objects, according to one preferred embodiment of the present invention, the liquid crystal color display device includes a liquid crystal display cell exhibiting the Fredericksz transition effect, and a driving circuit for driving the display cell. At least one of opposed electrodes of the liquid crystal display cell is divided into a plurality of electrode members aligned in a row, while the driving circuit supplies (to the plurality of electrode members driving voltages the voltages being applied sequentially and having different levels, the levels corresponding to the order of alignment of the plurality of electrode members. The display device further includes a circuit for stepping down an AC power source voltage to a predetermined low voltage level which is then supplied to a common electrode member formed by the other of the opposed electrodes of the liquid/crystal display cell, the common electrode member applying a potential difference (equal to the difference between the driving voltages and the predetermined low voltage or bias voltage) to the liquid crystal. By this arrangement, it is possible to readily effect the liquid crystal display such that the range for bringing the liquid crystal display device into a functioning state is varied, the range depending on the magnitude of the control signal level, the liquid crystal cell exhibiting different colors at each portion of the liquid crystal cell under the functioning state.

Figure 2:
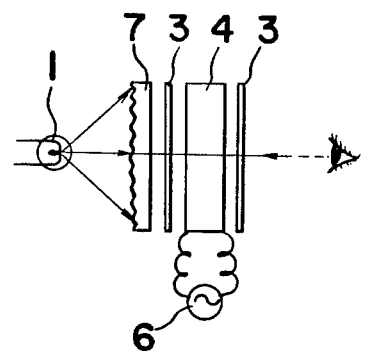
Figure 3:
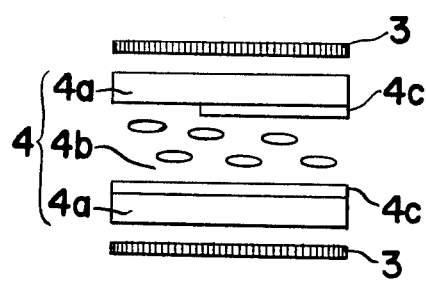
Figure 4:
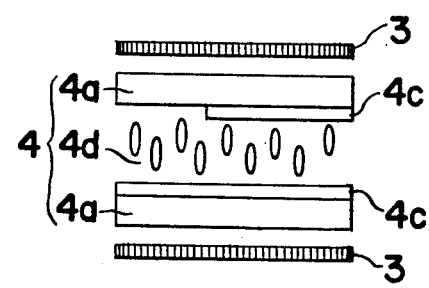
Figure 5:
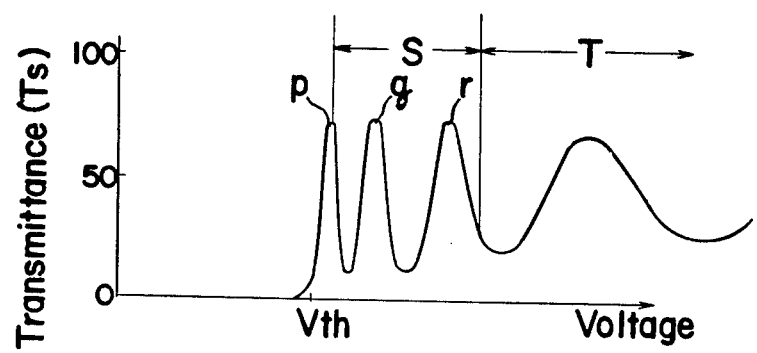
Figure 6:
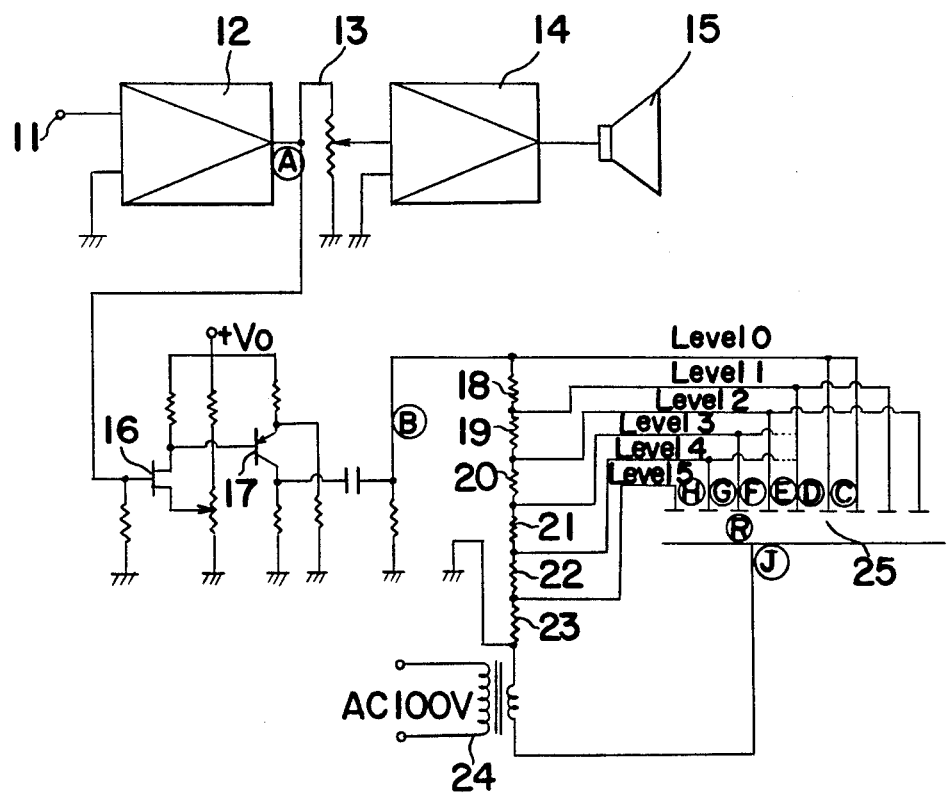
Figure 7:
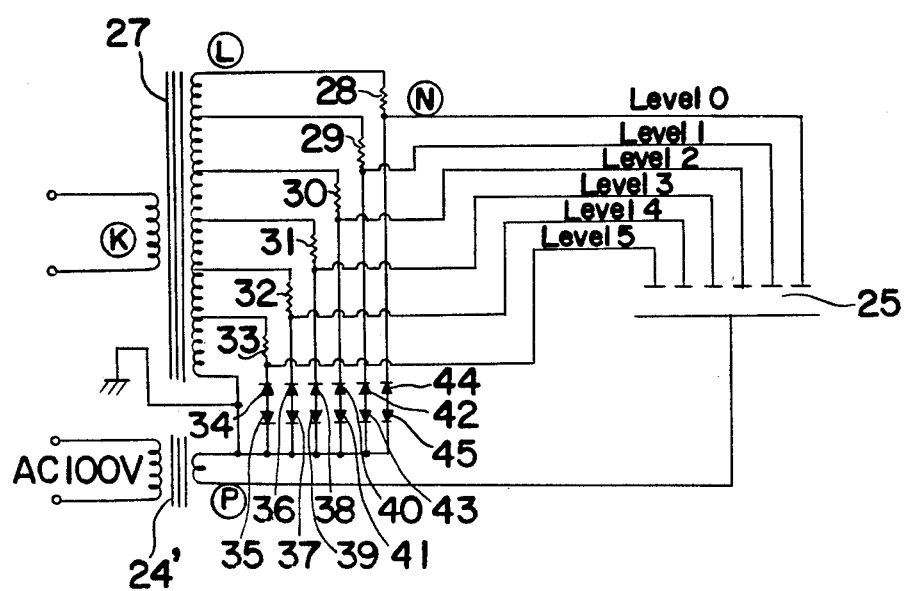
Figure 8:
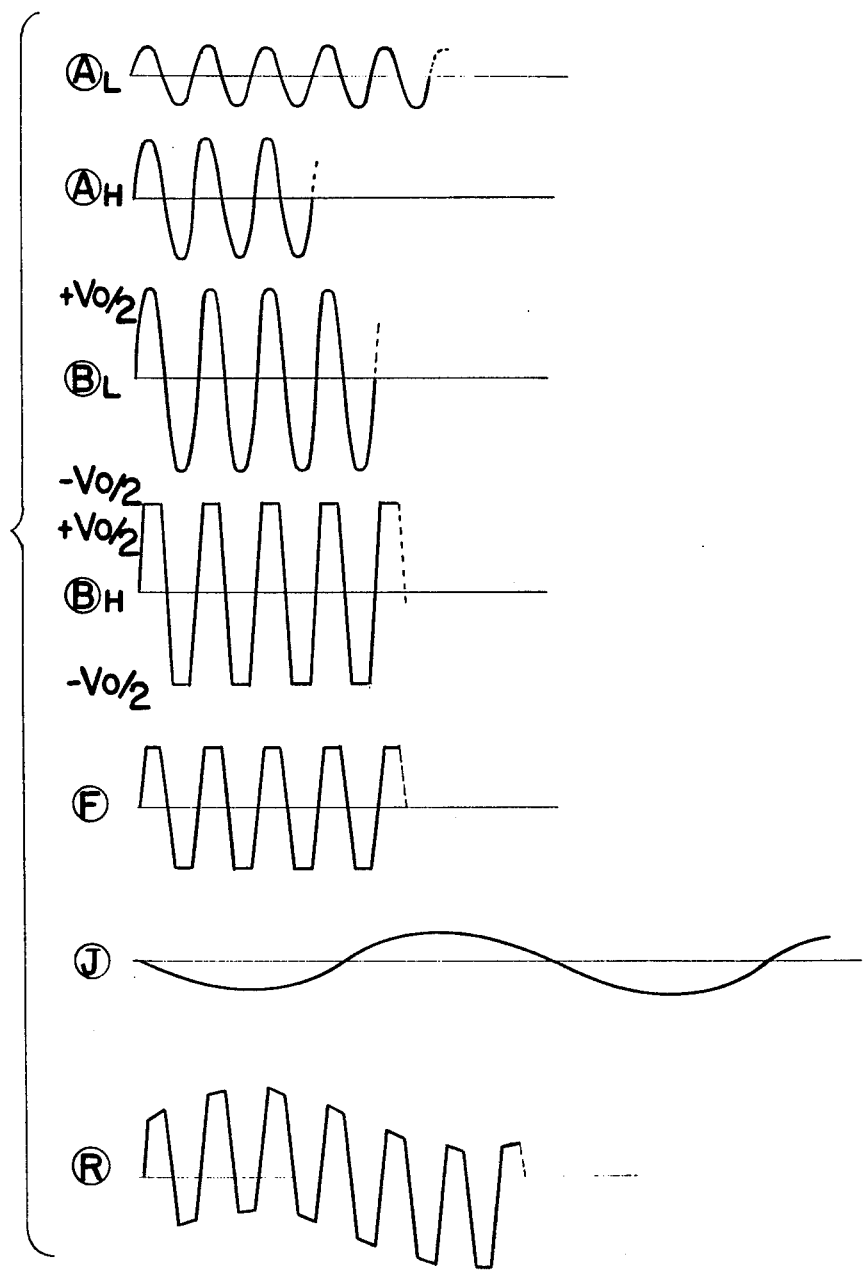
Figure 9:
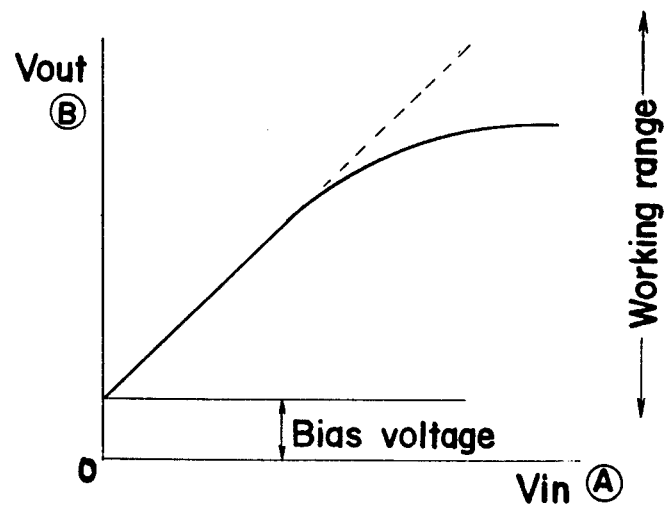
Figure 10:
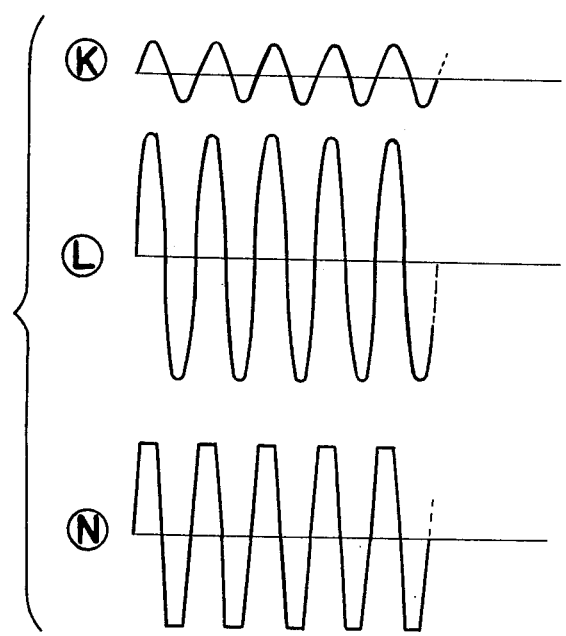

These and other objects and features of the present invention will become apparent from the following description taken in conjunction with the preferred embodiment thereof with reference to the accompanying drawings in which:

FIG. 1 is a schematic diagram showing the operating principle of one system of a color display device the utilizing Fredericksz effect, FIG. 2 is a similar view to FIG. 1, but particularly showing another system of a color display device utilizing the Fredericksz effect, FIGS. 3 and 4 are schematic diagrams showing arrangements of color display cells according to classifications of the Fredericksz effect, FIG. 5 is a graph showing the relationship between voltage and light transmittance, FIG. 6 is an electrical circuit diagram showing a circuit construction for a color display means according to one preferred embodiment of the present invention, FIG. 7 is a similar diagram to FIG. 6, but particularly showing a modification thereof, FIG. 8 is a diagram showing waveforms of voltages at various parts of the circuit of FIG. 6, FIG. 9 is a graph showing a relationship between input and output voltages in the circuit of FIG. 6, and FIG. 10 is a diagram showing waveforms of voltages at various parts of the circuit of FIG. 7.

Before the description of the present invention proceeds, it is to be noted that like parts are designated by like reference numerals throughout several views of the accompanying drawings.

Referring now to the drawings, there is shown in FIG. 1 the operating principle of a liquid crystal color display device generally referred to as DAP (deformation of vertical aligned phases) and utilizing the known Fredericksz transition effect. In FIG. 1, the color display device of the projection type generally includes a light source 1, a liquid crystal cell 4 connectable to an AC voltage source 6 and disposed between a pair of spaced polarizing plates 3 which are further positioned between lenses 2, and a screen plate 5, and is so arranged as to obtain colors of various wave lengths by altering alignment of liquid crystal molecules in the liquid crystal cell 4 through variation of the voltage applied to the electrodes of the cell 4 by the voltage source 6.

It should be noted here that the projection type color display device of FIG. 1 may be modified to a transmitting type color display device as shown in FIG. 2 in which the lenses 2 and screen plate 5 described as employed in the project type color display means of FIG. 1 are dispensed with, while a scattering diffusion plate 7 is disposed between the light source 1 and a corresponding one of the polarizing plates 3. In either of the arrangements of FIGS. 1 and 2, it is possible to achieve efficient display.

The liquid crystal cell 4 is classified in its Fredericksz effect into two types, i.e., a first type in which nematic liquid crystal molecules are initially of homogeneous alignment and a second type by which liquid crystal molecules are initially of homeotropic alignment. Although these two types are the same in the principle for display, the first type shown in FIG. 3 is referred to as HB type, and the second type shown in FIG. 4 is referred to as VB type hereinbelow. In the HB type liquid crystal cell of FIG. 3, a liquid crystal group having positive dielectric anisotropy is employed, while in the VB type liquid crystal cell of FIG. 4, liquid crystal group having negative dielectric anisotropy is adopted.

More specifically, the liquid crystal groups with positive dielectric anisotropy typically have the formula

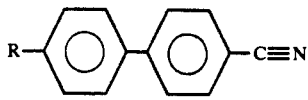

wherein R is of alkyl group or alkoxy group with C of five to eight, while the liquid crystal groups having negative dielectric anisotropy includes known methoxy-benzyliden butyl aniline (MBBA), mixed liquid crystal of ethoxybenzyliden butyl aniline (EBBA), etc. It is needless to say that the liquid crystal groups employable for the present invention are not limited to the above, but other various nematic liquid crystals having positive or negative dielectric anisotropy may be adopted as well for the purposes of the present invention.

In construction, the display unit of Fredericksz HB type of FIG. 3 has the liquid crystal cell 4 disposed between the polarizing plates 3 and including a pair of spaced substrates 4a, for example, of glass material, transparent electrodes 4c applied onto inner faces of the substrates 4a respectively and a layer 4b of homogeneous liquid crystal held between the substrates 4a. While in the display unit of the Fredericksz VB type of FIG. 4, the layer 4b in FIG. 3 is replaced by a layer 4d of homeotropic liquid crystal, with other construction being generally the same as in FIG. 3.

Incidentally, it is known that transmitting light spectrum Ts of the HB or VB type display means placed in the polarizer of a cross nicol is represented by the following equation $$Ts = \sin^2(2\phi) \cdot \sin^2 \frac{\pi d \Delta n}{\lambda} \quad (1)$$

where $\phi$ is the azimuth angle equal to $\pi/4$ and formed by the incident polarized light and the long axis of liquid crystal molecules (extraordinary light ray direction), d is the thickness of liquid crystal layer, $\Delta n$ is the difference between the extraordinary light ray refractive index and the ordinary light ray refractive index, and $\lambda$ is the wave length of incident light. Since $\sin^2(2\phi)$ is 1 on the assumption that $\phi = \pm \pi/4$, the term $\sin^2 \pi d \Delta n/\lambda$ for the transmittance spectrum can be reflected in the transmitting light spectrum Ts most efficiently. The Fredericksz transition effect is characterized in that the value of $\Delta n$ can be altered through variation of voltage applied to the HB or VB type display means, and upon variation of $\Delta n$, the transmitting light spectrum Ts is subjected to spectroscopy according to the equation (1) for displaying various colors.

Referring to FIG. 5, there is shown the variation of transmitting light output with respect to voltage when the light source is monochromatic light. In FIG. 5, it is noticed that the peak position of the transmitting light spectrum Ts is varied when another light source of monochromatic light is employed. In other words, when white light is employed and the voltage is varied, peaks representing different colors are achieved thereby displaying different colors. It should be noted here, however, that in FIG. 5, output light close to the monochromatic light is obtained only in a region S including peaks p, q and r, and that, in a region T, in which voltage higher than that in the region S is applied, the color becomes cloudy, because of overlapping peak values of different wave lengths in the region T. It should also be noted that in the color display means employing liquid crystals as described in the foregoing, threshold phenomenon is noticed in a similar manner as that which was noticed when using other kinds of liquid crystals. In other words, electro-optical response is started from a certain fixed voltage value Vth. Moreover, in such liquid crystals as described in the foregoing, variation from one shade to another takes place at a voltage variation less than one volt. It is possible to vary the shade of display through minor variations in the voltage, in which case AC driving is preferable to DC driving from the viewpoint of prevention of electrochemical reaction, and frequency of the AC driving employable may be in such a range as will exceed more than several tens of KHz.

It should be noted here that the present invention particularly relates to a color display device utilizing liquid crystals having features as described in the foregoing.

Referring now to FIGS. 6, 8 and 9, there is shown in FIG. 6 a circuit construction in which the liquid crystal display device of the present invention is applied, for example, to an arrangement thereby sound is indicated by utilizing different colors (sound display).

In FIG. 6, a pre-amplifier 12 having an input terminal 11 is coupled through a volume control 13 to a main amplifier 14 which is further coupled to a loud speaker 15, and a sound signal is applied to the input terminal 11 and is amplified by the pre-amplifier 12 and the main amplifier 14 thereby reproducing the sound from the loud speaker 15. For color display of the sound, part of an output signal from the pre-amplifier 12 is taken out for voltage amplification be a FET transistor 16 and a transistor 17. Shown in FIG. 8 are waveforms of voltages at portions (A), (B), (F), (J) and (R) in FIG. 6. As is seen from FIG. 8, when the input at the portion (A) of FIG. 6 is small, amplification is effected without distortion, while if the input at the same portion (A) is large, peaks of amplitude are cut at a voltage equal to ½ of power source voltage $V_0$ as shown at (B)$_H$ of FIG. 8. Accordingly, in FIG. 9, although the output voltage $V_{out}$ at the portion (B) of FIG. 6 increases linearly with respect to the input voltage $V_{in}$ when the input voltage $V_{in}$ at the portion (A) of FIG. 6 is small, note that any further increase of the output voltage $V_{out}$ is suppressed when the input voltage $V_{in}$ becomes larger. In this case, by determining the power source voltage $V_0$ and voltage amplification degree $A_0$ in such a manner that the working range of the output voltage $V_{out}$ shown in FIG. 9 is aligned with that shown in the voltage-transmittance characteristics of FIG. 5, the display does not enter the region in which colors become cloudy even if a large sound input is applied to the terminal 11. The output from the transistor 17 is coupled to series-connected resistors 18, 19, 20, 21, 22 and 23 for voltage division as in FIG. 6 to obtain voltages corresponding to sound signals of respective levels in a stepped manner, the voltages being further coupled to respective segments which are symmetrically formed in at least one of the opposed transparent electrodes of the liquid crystal cell 25 which further includes two pairs of transparent electrodes. To the other of the opposed electrodes i.e., a common side of the cell 25, a secondary side of a transformer 24 in which an input AC voltage of 100 V is lowered to a range of three to five volts output is connected for impressing a potential difference therebetween to the liquid crystal cell 25. Taking the level 3 of FIG. 6 as an example, the voltage at (F) of FIG. 8 is applied to the segment side, while the voltage at (J) of FIG. 8 is impressed to the common side, with the potential difference (R) therebetween being applied to the segment for the level 3. By causing the liquid crystal cell 25 to function in the above described manner, the AC voltage is applied to a portion spreading from the central portion of the liquid crystal cell 25 in the stepped manner. Accordingly, variation of colors are produced depending on the delay in the speed of response of the liquid crystal cell and the length of time for impressing the AC voltage, while patterns laterally spread from the central portion of the cell 25 depending on the magnitude of amplitude (which is produced by the magnitude of the sound signal) and can be displayed for application as a level indicator.

Referring also to FIGS. 7 and 10, there is shown in FIG. 7 a modification of the driving circuit of FIG. 6. In this modification, the output from the pre-amplifier 12 described as coupled through the FET 16 and transistor 17 to the resistors 18 to 23 for voltage division in FIG. 6 is modified and is stepped up by a transformer 27 having taps in its secondary side corresponding in number to the number of the segments of the cell 25 for voltage division through resistors 28, 29, 30, 31, 32 and 33, while Zener diodes 34, 35, 36, 37, 38, 39, 40, 41, 42, 43, 44 and 45 are connected in pairs between the secondary side of the transformer 24' and resistors 28 to 33 respectively so as to obtain input and output characteristics as in FIG. 9, with waveforms of voltages at the portions (K), (L) and (N) of FIG. 7 being shown in FIG. 10 in the similar manner as in FIG. 8. Since other construction and function of the circuit of FIG. 7 are the similar to those in FIG. 6, detailed description thereof is abbreviated for brevity.

It should be noted that in the foregoing embodiments, although the present invention is mainly described with reference to display of sound signals, the color display device of the invention is not limited in its application to such sound signals alone, but may readily be applicable to any other signals within the scope of the present invention.

It should also be noted that the common side or common electrode described as employed in the foregoing embodiment may be formed into separate electrodes depending on the necessity.

As is clear from the foregoing description, according to the present invention, it is possible, through utilization of liquid crystals, to readily effect display in which the range for bringing the liquid crystal into a functioning state is varied depending on the magnitude of the control signal level, with different color at each portion of the liquid crystal cell under the functioning state. Furthermore, since the color display means of the present invention is simple in construction and stable in functioning, while efficient display is available at all times, it is particularly suited for incorporation into various electrical and electronic equipment and appliances at low cost.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as included therein.

What is claimed is:

1. A multi-colored liquid crystal display cell comprising:

first and second opposed electrode means having liquid crystal material disposed therebetween, said first electrode means comprising a plurality of spaced segment electrodes arranged in a row, said second electrode means being substantially coextensive with said first electrode means along said row;

said liquid crystal material exhibiting a Fredericksz transition effect wherein said material transmits different characteristic colors of light in response to different voltage levels applied across said first and second electrode means in an operating range defined between a minimum threshold voltage and a maximum cut-off voltage, said liquid crystal material blocking the transmission of light therethrough for applied voltages below said minimum threshold voltage and transmitting light with a cloudy appearance for applied voltages above said maximum cut-off voltages;

signal voltage source means for applying different signal voltage levels to each of the segment electrodes in stepped incremental levels to exhibit an incremental color change across said cell along said row;

control means for precluding the application of voltages from said signal voltage source above said maximum cut-off voltage to preclude the occurrence of said cloudy appearance; and bias voltage source means for applying a bias voltage substantially corresponding to said minimum threshold voltage level to said second electrode means to thereby assure that at least some color will be visually perceived across the face of said cell in the regions of said segment electrodes regardless of the voltage levels applied thereto by said signal voltage source.

2. A liquid crystal color display cell comprising:

first and second opposed electrode means having liquid crystal material disposed therebetween, said first electrode means comprising a plurality of spaced segment electrodes arranged in a row, said second electrode means being substantially coextensive with said first electrode means along said row;

said liquid crystal material exhibiting a Fredericksz transition effect wherein said material transmits different characteristic colors of light in response to different voltage levels applied across said first and second electrode means in an operating range defined between a minimum threshold voltage and a maximum cut-off voltage, said liquid crystal material blocking the transmission of light therethrough for applied voltages below said minimum threshold voltage and transmitting light with a cloudy appearance for applied voltages above said maximum cut-off voltage;

a signal voltage source means for applying a different voltage level to each of the segment electrodes in stepped incremental levels to exhibit an incremental color change across said cell along said row; and bias voltage source means for applying a bias voltage substantially corresponding to said minimum threshold voltage level to said second electrode means to thereby assure that at least some color will be visually perceived across the face of said cell in the regions of said segment electrodes regardless of the voltage levels applied thereto by said signal voltage source.

3. The multi-colored liquid crystal display cell of claim 1, wherein said signal voltage source means applies the lowest of said signal voltage levels to a segment electrode disposed in substantially the center of said row and symmetrically applies stepped increasing signal voltage levels in opposed directions of said row beginning from said center, whereby said cell generates a spreading color display of signal voltage levels increasing from low to high from said center to the ends of said row.

4. The multi-colored liquid crystal color display cell of claim 1, further including:

means for generating a signal related to sound intensity;

transducer means for converting the sound intensity signal to a corresponding voltage waveform and applying the same to said signal voltage source means, said signal voltage source means generating said different signal voltage levels from said voltage waveform;

whereby the different colors on said display represent different sound intensity levels.

5. The multi-color liquid crystal display cell of claim 1 or 2, wherein said signal voltage source includes a voltage divider and an A.C. input voltage applied to said divider, said divider generating the respective signal voltage levels applied to said segment electrodes.

6. A multi-color liquid crystal display device in accordance with claim 1 or 2, wherein said liquid crystal material exhibits a positive dielectric anisotropy with said Fredericksz effect, said material having nematic liquid crystal molecules, the initial alignment of said nematic liquid crystal molecules being homogeneous.

7. A multi-color liquid crystal display device in accordance with claim 1 or 2, wherein said liquid crystal material exhibits a negative dielectric anisitropy with said Fredericksz effect, said material having nematic liquid crystal molecules, the initial alignment of said nematic liquid crystal molecules being homeotropic.

8. The multi-colored liquid crystal display cell of claims 1 or 2, wherein said bias voltage is an A.C. voltage.

* * * * *

UNITED STATES PATENT AND TRADEMARK OFFICE
CERTIFICATE OF CORRECTION

PATENT NO. : 4,411,496
DATED : October 25, 1983
INVENTOR(S) : NONOMURA et al

It is certified that error appears in the above–identified patent and that said Letters Patent are hereby corrected as shown below:

In the Heading of the Patent, in the category "[22] Filed", delete "Dec. 12, 1980" and insert --Dec. 12, 1979--.

Signed and Sealed this

Sixth Day of March 1984

[SEAL]

Attest:

Attesting Officer

GERALD J. MOSSINGHOFF

Commissioner of Patents and Trademarks